United States Patent
Camagong et al.

(10) Patent No.: US 11,959,874 B2
(45) Date of Patent: Apr. 16, 2024

(54) NANOSTRUCTURE FEATURING NANO-TOPOGRAPHY WITH OPTIMIZED ELECTRICAL AND BIOCHEMICAL PROPERTIES

(71) Applicant: International Business Machines Corporation, Armonk, NY (US)

(72) Inventors: Cristina Camagong, Ridgefield, CT (US); Hariklia Deligianni, Alpine, NJ (US); Emily R. Kinser, Poughkeepsie, NY (US); Roy Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 217 days.

(21) Appl. No.: 16/204,545

(22) Filed: Nov. 29, 2018

(65) Prior Publication Data
US 2020/0173953 A1    Jun. 4, 2020

(51) Int. Cl.
 G01N 27/327 (2006.01)
 B82B 1/00 (2006.01)
 B82B 3/00 (2006.01)

(52) U.S. Cl.
 CPC ......... *G01N 27/3278* (2013.01); *B82B 1/005* (2013.01); *B82B 3/008* (2013.01); *G01N 27/3276* (2013.01)

(58) Field of Classification Search
 CPC ............ G01N 27/3278; G01N 27/3276; B82B 1/005; B82B 3/008; B81B 2201/0214
 USPC ..................................................... 204/403.14
 See application file for complete search history.

(56) References Cited

U.S. PATENT DOCUMENTS

| | | | |
|---|---|---|---|
| 4,969,468 | A | 11/1990 | Byers et al. |
| 6,171,239 | B1 | 1/2001 | Humphrey |
| 6,359,444 | B1 | 3/2002 | Grimes |
| D469,540 | S | 1/2003 | Holker et al. |
| 6,914,279 | B2 | 7/2005 | Lu et al. |
| 7,005,048 | B1 | 2/2006 | Watanabe et al. |
| 7,006,859 | B1 | 2/2006 | Osorio et al. |
| 7,212,851 | B2 | 5/2007 | Donoghue et al. |
| 7,294,910 | B2 | 11/2007 | Thomas et al. |
| 7,524,408 | B2 | 4/2009 | Monbouquette et al. |

(Continued)

FOREIGN PATENT DOCUMENTS

| CN | 104502429 A | 10/2015 |
|---|---|---|
| CN | 107589163 A | 1/2018 |

(Continued)

OTHER PUBLICATIONS

Kim, Sohee et al., "Thermal impact of an active 3-D microelectrode array implanted in the brain." IEEE Transactions on Neural Systems and Rehabilitation Engineering, vol. 15, No. 4, 2007, pp. 493-501.

(Continued)

*Primary Examiner* — Kourtney R S Carlson
(74) *Attorney, Agent, or Firm* — CANTOR COLBURN LLP; Stosch Sabo

(57) ABSTRACT

A nanostructure includes a base layer including a surface. The nanostructure further includes nano-patterned features including non-random topography located on the surface of the base layer. The nanostructure also includes an encapsulating layer including a conductive material arranged on the nano-patterned features.

10 Claims, 13 Drawing Sheets

(56) References Cited

U.S. PATENT DOCUMENTS

| | | | |
|---|---|---|---|
| 7,894,914 | B2 | 2/2011 | Stahmann et al. |
| 7,946,050 | B2 | 5/2011 | Chiou et al. |
| 7,949,382 | B2 | 5/2011 | Jina |
| 7,955,483 | B2 | 6/2011 | Gu et al. |
| 8,076,125 | B2 | 12/2011 | McGimpsey |
| 8,097,926 | B2 | 1/2012 | De Graff et al. |
| 8,221,822 | B2 | 7/2012 | Flanagan et al. |
| 8,255,061 | B2 | 8/2012 | Perlin et al. |
| 8,355,768 | B2 | 1/2013 | Masmanidis et al. |
| 8,529,835 | B2 | 9/2013 | Kaplan et al. |
| 8,574,789 | B1 | 11/2013 | Shelnutt et al. |
| 8,668,978 | B2 | 3/2014 | Malima et al. |
| 8,708,966 | B2 | 4/2014 | Allen et al. |
| 8,741,380 | B2 * | 6/2014 | Yoshida ............... B82Y 10/00 427/2.28 |
| 8,772,228 | B2 | 7/2014 | Stupp et al. |
| 8,808,516 | B2 | 8/2014 | Melosh et al. |
| 8,831,750 | B2 | 9/2014 | Ramachandran et al. |
| 8,888,969 | B2 * | 11/2014 | Soleymani ......... G01N 27/3272 204/289 |
| 9,095,267 | B2 | 8/2015 | Halpern et al. |
| 9,243,277 | B2 | 1/2016 | Rajagopal et al. |
| 9,399,128 | B2 | 7/2016 | Tooker et al. |
| 9,662,498 | B1 | 5/2017 | Son et al. |
| 9,844,660 | B2 | 12/2017 | Vetter et al. |
| 2003/0100823 | A1 | 5/2003 | Kipke et al. |
| 2005/0269285 | A1 | 12/2005 | Jung et al. |
| 2006/0293578 | A1 | 12/2006 | Rennaker, II |
| 2007/0106143 | A1 | 5/2007 | Flaherty |
| 2008/0177363 | A1 | 7/2008 | Schouenborg |
| 2008/0214920 | A1 | 9/2008 | Merz et al. |
| 2009/0155800 | A1 | 6/2009 | Hong et al. |
| 2009/0243584 | A1 | 10/2009 | Zhang et al. |
| 2010/0006451 | A1 | 1/2010 | Gordon et al. |
| 2010/0066346 | A1 * | 3/2010 | Zhang ................... C25D 11/12 428/167 |
| 2010/0241086 | A1 * | 9/2010 | Yodfat ................. A61B 5/1486 604/246 |
| 2010/0318193 | A1 | 12/2010 | Desai et al. |
| 2011/0091510 | A1 | 4/2011 | Lele et al. |
| 2011/0230735 | A1 * | 9/2011 | Wolfe ................ A61B 5/14503 600/309 |
| 2011/0301716 | A1 | 12/2011 | Sirivisoot et al. |
| 2012/0218550 | A1 | 8/2012 | O'Mahony |
| 2013/0200437 | A1 | 8/2013 | Rha |
| 2014/0230854 | A1 | 8/2014 | Lopez et al. |
| 2014/0238574 | A1 | 8/2014 | Kinser et al. |
| 2015/0133761 | A1 | 5/2015 | Vetter et al. |
| 2016/0041159 | A1 | 2/2016 | Labaer et al. |
| 2016/0257959 | A1 | 9/2016 | Alsager et al. |
| 2016/0281147 | A1 * | 9/2016 | Besant ................. C12Q 1/6825 |
| 2017/0209079 | A1 * | 7/2017 | Kinser ................ A61B 5/1468 |
| 2018/0020957 | A1 | 1/2018 | Kinser |
| 2018/0353750 | A1 | 12/2018 | Hetke et al. |
| 2020/0170523 | A1 | 6/2020 | Deligianni et al. |
| 2020/0176262 | A1 | 6/2020 | Camagong et al. |

FOREIGN PATENT DOCUMENTS

| | | |
|---|---|---|
| KR | 101203898 B1 | 11/2012 |
| WO | 2010003212 A1 | 1/2010 |

OTHER PUBLICATIONS

Martel, S. et al., "Development of a wireless brain implant: the telemetric electrode array system (TEAS) project." 23rd Annual International Conference of the Engineering in Medicine and Biology Society, 2001, pp. 3594-3597.

Cristina Camagong, et al., "Nanostructure Featuring Nano-Topography With Optimized Electrical & Biochemical Properties", U.S. Appl. No. 16/204,438, filed Nov. 29, 2018.

Deshpande et al., "Development of a nanoscale heterostructured glucose sensor using modified micorfabrication processes", J. of Micro/Nanolithography MEMS MEOMS, vol. 7(2), Apr.-Jun. 2008, 6 pages.

Emily R. Kinser et al., "Nanopatterned Bulk Metallic Glass Biosensors", ACS Sensors, vol. 2, No. 12, 2017, 30 pp.

Freckmann et al. "System Accuracy Evaluation of 27 Blood Glucose Monitoring Systems According to DIN EN ISO 15197", Diabetes Technology & Therapeutics, vol. 12, No. 3, 2010, 12, pp. 221-231.

Hariklia Deligianni, et al., "Three-Dimensional Silicon-Based Comb Probe With Optimized Biocompatible Dimensions for Neural Sensing & Stimulation", U.S. Appl. No. 16/204,607, filed Nov. 29, 2018.

Janine Gajdzik, et al., "Enzyme immobilisation on self-organised nanopatterned electrode surfaces", www.rsc.org/pccp | Physical Chemistry Chemical Physics, Received Jun. 16, 2010, Accepted Aug. 12, 2010, pp. 12604-12607.

List of IBM Patents or Patent Applications Treated as Related; (Appendix P), Filed Nov. 30, 2018, 2 pages.

Marco Cardosi et al., "Amperometric Glucose Sensors for Whole Blood Measurement Based on Dehydrogenase Enzymes", INTECH Open Science Open Minds, Chapter 13, 2012 pp. 319-354.

Padmanabhan et al., "Engineering Cellular Response Using Nanopatterned Bulk Metallic Glass", ACS Nano Article, 2014, vol. 8, No. 5, pp. 4366-4375.

Parng, et al., "Effect of temperature and glucose concentration on a glass-based sensor for long-term stability Investigation", Journal of Micro/Nanolithography MEMS MEOMS. Vol. 10(1) Jan.- Mar. 2011 pp. 5.

Roy R. Yu, et al., "Three-Dimensional Silicon-Based Comb Probe", U.S. Appl. No. 16/204,703, filed Nov. 29, 2018.

Yuan Yuan et al., "Seed-mediated synthesis of dendritic platinum nanostructures with high catalytic activity for aqueous-phase hydrogenation of acetophenone", Journal of Energy Chemistry 24 (2015) 660-668.

Zhai et al., "Highly Sensitive Glucose Sensor Based on Pt Nanoparticle/ Polyaniline Hydrogel Heterostructures", ACS Nanoparticles, vol. 7(4), 2013, pp. 3540-3546.

Lou et al., "Electroplating", Encyclopedia of Chemical Processing, 2006 (10 pages).

Cao et al., "Template-based synthesis of nanorod, nanowire, and nanotube arrays", Advances in Colloid and Interface Science 2008, 136, pp. 45-64. Available online Jul. 26, 2007 (Year: 2007).

Zou et al., "Dendritic Heterojunction Nanowire Arrays for High-Performance Supercapacitors", Scientific Reports 6:7862 (Year: 2015) 7 pages.

* cited by examiner

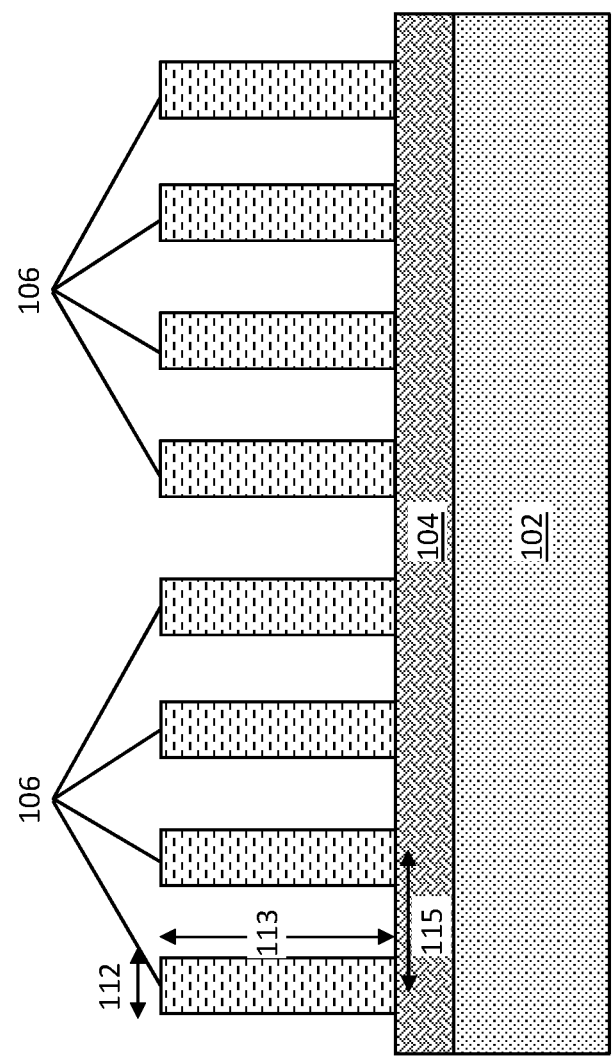

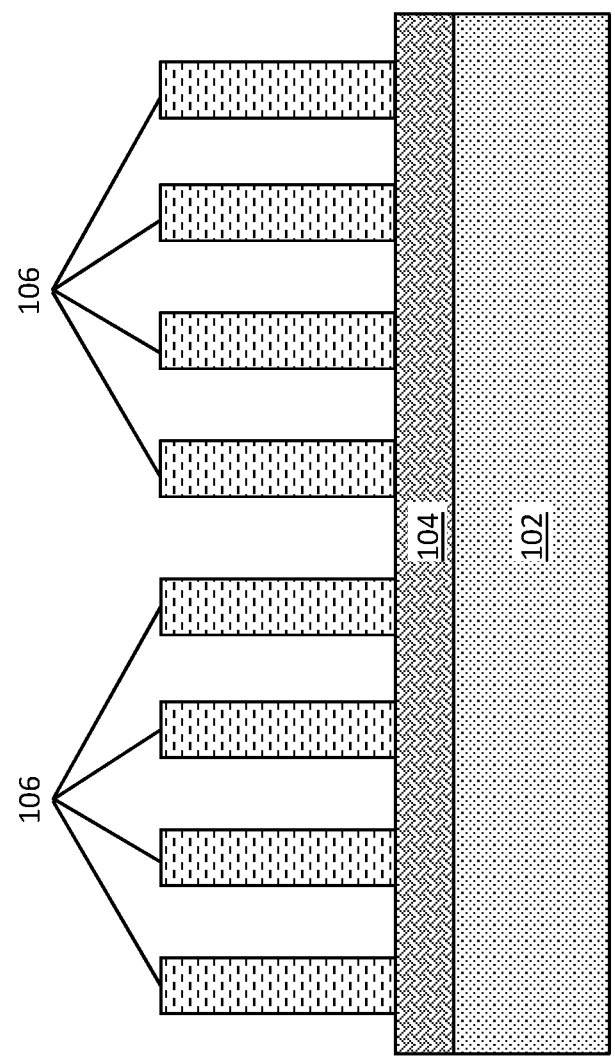

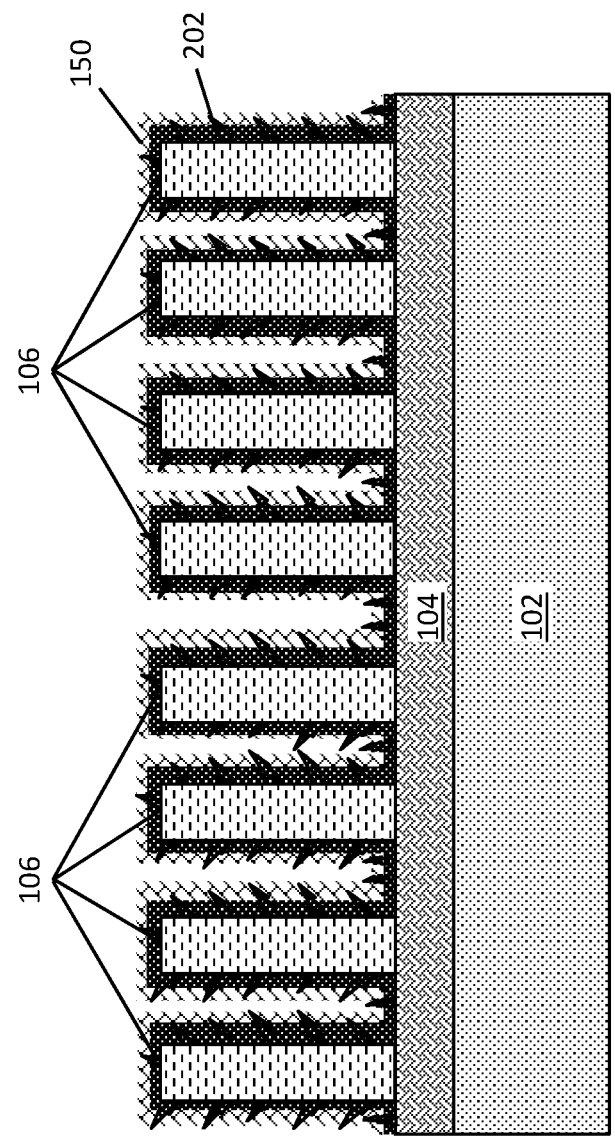

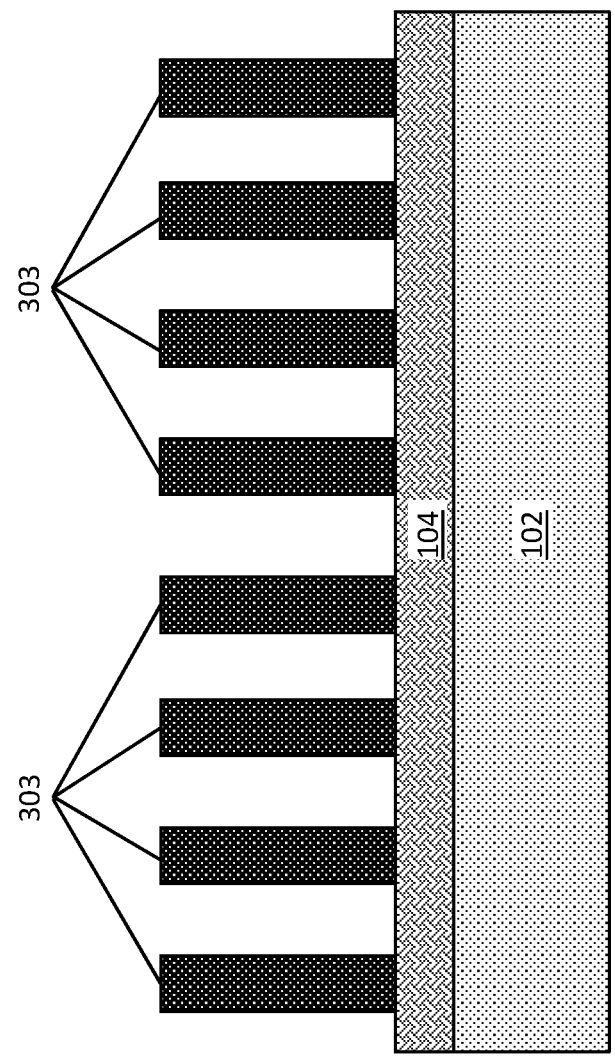

NANOSTRUCTURE FEATURING NANO-TOPOGRAPHY WITH OPTIMIZED ELECTRICAL AND BIOCHEMICAL PROPERTIES

BACKGROUND

The present invention generally relates to nanostructures. More specifically, the present invention relates to nanostructures featuring nano-topography with optimized electrical and biochemical properties, which can be utilized for biological applications.

A biosensor is an analytical device that can be utilized to collect information about a biological system. Data collection methods can include, but are not limited to, optical, acoustic, electrical, and electrochemical systems. Biosensors can incorporate a sensitive biological component to positively identify a specific biological component in a given system, such as an enzyme, or biosensors can be utilized without any additional biological elements, which is referred to as "label-free" sensing. Electrochemical biosensing systems typically include a biological component and a physicochemical detector, which work together to detect an analyte with specificity, which generates an electric signal as output. The sensitive biological component/element, e.g., tissue, microorganism, organelle, cell receptor, enzyme, antibody, nucleic acid, etc., is a biologically derived material or biomimetic component that interacts with, binds to, or otherwise recognizes the analyte. Examples of such pairings include reactions related to antibodies and antigens, enzymes and substrates, and pairings of single strands of DNA. Cell receptors, organelles, microorganisms, and tissues can carry such receptors. The biologically sensitive element can also be created by biological engineering.

In the specific case of electrochemical biosensing, once a receptor is paired with a target, a redox reaction produces a product, such as $H^+$ or electrons, and the physiochemical sensor detects the reaction signals. For other means of biosensing, fluorophore molecules with specific binding reactions can also be used for detection, or other analytical methods such as Raman spectroscopy can be utilized to identify specific biological components.

Biosensors with enhanced signal and sensitivity provide reliable data for both medical and environmental monitoring. Such biosensors are especially needed for areas related to food and water supply security, as well as the healthcare industry.

In healthcare, glucose sensors contribute to a significant portion of the existing biosensor market. A signal from a glucose sensor is typically generated via an electrode that is exposed to a glucose-containing biological substance, such as blood. A bioactive agent is physically applied to or arranged adjacent to the electrode, which is typically an enzyme such as glucose oxidase or glucose dehydrogenase. The majority of glucose sensors are designed for testing external to the human body in the "test strip" form as single-use sensors. Additionally, in vivo glucose sensors that are implanted into a human body can be used to continuously monitor blood sugar. However, the body's foreign body response restricts, e.g., affects and reduces the effectiveness of, in vivo biosensors. Moreover, the foreign body response can reduce the sensor signal output over time.

The electrode within a glucose biosensor serves two critical purposes. A first purpose is a physical surface on which the enzyme can be located, and a second purpose is a means of conducting the electrical signal that is generated in response to the specific electrochemical reaction. Typically, a glucose biosensor includes two electrodes, including a "working" electrode that is loaded with, or arranged in the proximity of, enzyme and a reference electrode. Ideally, a third counter electrode can also be added to enhance the signal-to-noise ratio. Platinum (Pt), for example, has demonstrated biocompatibility and is frequently used as a working electrode in electrochemical biosensors. Additional electrode materials can include carbon, gold, or other materials known in the art. The target electrochemical reaction typically determines the electrode material selection. External "test strip" electrochemical sensors can include platinum electrodes, for example.

SUMMARY

Embodiments of the present invention are directed to a nanostructure. A non-limiting example of the nanostructure includes a base layer including a surface. The nanostructure further includes nano-patterned features including non-random topography located on the surface of the base layer. The nanostructure also includes an encapsulating layer including a conductive material arranged on the nano-patterned features.

Another non-limiting example of the nanostructure includes a base layer including a surface. The nanostructure further includes nano-patterned features including non-random topography located on the surface of the base layer. The nanostructure also includes a textured metal layer including a conductive material arranged on the nano-patterned features.

Another non-limiting example of the nanostructure includes a base layer including a surface. The nanostructure further includes nano-patterned features including non-random topography located on the surface of the base layer. The nano-patterned features have a textured surface. The nano-patterned features and the textured surface are formed as a single structure without an interface therebetween.

Embodiments of the present invention are directed to a biosensor structure. A non-limiting example of the biosensor structure includes an electrode base including a surface. The biosensor further includes nano-patterned features including non-random topography located on the surface of the electrode base. The biosensor includes an encapsulating layer including a conductive material arranged on the nano-patterned features. The biosensor also includes a biological functionalization material arranged on the encapsulating layer.

Another non-limiting example of the biosensor structure includes an electrode base including a surface. The biosensor structure further includes nano-patterned features including non-random topography located on the surface of the electrode base. The nano-patterned features have a textured surface. The biosensor structure also includes a biological functionalization material arranged on the encapsulating layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1A-1E depict a method of forming a nanostructure according to one or more embodiments of the present invention, in which:

FIG. 1A depicts a cross-sectional side view of a base layer arranged on a substrate;

FIG. 1B depicts a cross-sectional side view after forming an array of nano-patterned features on the base layer;

FIG. 1C depicts a top view of FIG. 1B;

FIG. 1D depicts a cross-sectional side view after depositing an encapsulating metal layer on the nano-patterned features; and FIG. 1E depicts a cross-sectional side view after functionalizing the surface of the encapsulating metal layer;

FIGS. 2A-2C depict a method of forming a nanostructure according to one or more embodiments of the present invention, in which:

FIG. 2A depicts a cross-sectional side view of an array of nano-patterned features on the base layer;

FIG. 2B depicts a cross-sectional side view after depositing a textured layer of metal on the nano-patterned features; and FIG. 2C depicts a cross-sectional side view after functionalizing the surface of the textured layer of metal;

FIGS. 3A-3C depict a method of forming a nanostructure according to one or more embodiments of the present invention, in which:

FIG. 3A depicts a cross-sectional side view of an array of nano-patterned features on the base layer;

FIG. 3B depicts a cross-sectional side view after depositing a textured layer of metal on the nano-patterned features; and FIG. 3C depicts a cross-sectional side view after functionalizing the surface of the textured layer of metal;

FIGS. 4A-4B depict a method of forming a nanostructure according to one or more embodiments of the present invention, in which:

FIG. 4A depicts a cross-sectional side view of an array of nano-patterned features having a surface of textured surface; and FIG. 4B depicts a cross-sectional side view after functionalizing the surface of the nano-patterned features.

Figure 1A:
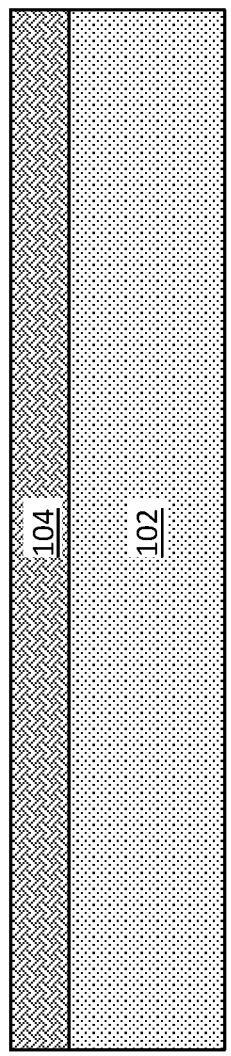

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor fabrication may or may not be described in detail herein. Moreover, the various tasks and process steps described herein can be incorporated into a more comprehensive procedure or process having additional steps or functionality not described in detail herein. In particular, various steps in the manufacture of semiconductors are known to those skilled in the art and so, in the interest of brevity, many conventional steps will only be mentioned briefly herein or will be omitted entirely without providing the well-known process details.

Turning now to an overview of technologies that are more specifically relevant to aspects of the invention, biosensors with enhanced sensor and signal sensitivity are needed in a variety of areas, including, for example, healthcare. The incorporation of topography with nano-scale features, referred to as nano-topography, on biosensor electrodes not only enhances signal and sensitivity due to increased surface area, such structures also can mitigate the biological foreign body response.

Platinum electrodes provide several advantages in biosensors. Platinum is considered to be a bio-compatible material. Platinum electrodes also are sensitive and can detect oxidants, which are relevant for enzyme-substrate systems, for example, in which glucose is reactant, such as glucose oxidase and glucose dehydrogenase. Glucose oxidase reacts with glucose to produce hydrogen peroxide, which decomposes via a reduction-oxidation reaction to result in W ions and electrons. The platinum electrode then detects the electrical signal that is proportional to the concentration of glucose. The exposed electrode surface also serves as a platform on which a target enzyme can reside. Additional surface area on the electrode enables increased enzyme loading, enhanced signal detection capability, and additional sensitivity to the target electrochemical reactions.

Despite the advantages associated with platinum as an electrode material, however, traditional platinum fabrication methods are not conducive to forming electrode surfaces with nano-topography in a consistent pattern and a high aspect ratio form-factor. The incorporation of high aspect ratio nano-topography, including but not limited to nano-rod structures, is necessary to achieve the electrical benefits of nano-patterned electrodes. Traditional platinum fabrication methods to produce articulated structures provide challenges. For example, atomic layer deposition (ALD) includes multiple process passes to produce a stand-along structure, whereas resulting films formed using PVD methods are too thick to form fine nanostructures. Additionally, due to the precious nature and high cost of platinum, manufacturers generally desire to use as little platinum as possible in final device structures.

Turning now to an overview of the aspects of the invention, one or more embodiments of the invention address the above-described shortcomings of the prior art by providing nano-patterned biosensor structures featuring consistent nano-topography with increased surface area and therefore optimized biosensor properties. According to one or more embodiments of the present invention, nano-patterned biosensor structures include gold nano-rods coated with a thin encapsulating layer of platinum. According to other embodiments of the present invention, gold and platinum nanorod structures are coated with a textured surface that results in an additional increase in effective surface area.

The above-described aspects of the invention address the shortcomings of the prior art by using nano-topography on the sensor surface to significantly increase the exposed surface area, and therefore, the signal and sensitivity of the electrode. Using crystalline gold or platinum rather than other amorphous biocompatible materials, such as bulk metallic glass, also increases the electrical conductivity of an electrochemical biosensor electrode. The nano-patterned arrays incorporating repeatable structures, such as nanorods have high uniformity. With the additional biosensor surface area resulting from the presence of said nano-structures, the biosensors have increased structural stability and improved consistency in signal output. The use of a thin encapsulating layer of platinum to enable both biocompatibility and use as an electrochemical bio senor, instead of forming the entire nanorod structure from platinum, reduces bio sensor cost and conserves platinum, which is in scarce supply. More importantly, the production process can be on executed using semiconductor-compatible processing, which enables scalability for mass production and more precise process control.

Turning now to a more detailed description of aspects of the present invention, FIGS. 1A-1E depict a method of forming a nanostructure according to one or more embodiments of the present invention. FIG. 1A depicts a cross-sectional side view of a base layer 104 arranged on substrate 102.

According to one or more embodiments of the present invention, the substrate 102 includes a semiconductor material. Examples of semiconductor materials known to those skilled in the art which can be used as substrate 102 include Si, SiGe, SiGeC, SiC, Ge alloys, MN compound semiconductors or II/VI compound semiconductors. In some embodiments of the present invention, the substrate 102 includes a single semiconductor material. In other embodiments of the present invention, the substrate 102 includes a multilayered stack of semiconductor materials.

In one or more embodiments of the present invention, the semiconductor material that can provide substrate 102 is a single crystalline semiconductor material such as, for example, single crystalline silicon. In other embodiments of the present invention, the semiconductor material that can provide substrate 102 is a polycrystalline semiconductor material such as, for example, polycrystalline silicon. In yet further embodiments of the present invention, the semiconductor material that can provide substrate 102 is an amorphous semiconductor material such as, for example, amorphous silicon. According to some embodiments of the present invention, the semiconductor material that provides substrate 102 is a bulk semiconductor material.

Another material that can be used as substrate 102 is a dielectric material. A "dielectric material" is a material (i.e., insulator) that does not conduct electricity readily. In one or more embodiments of the present invention, the dielectric material of the substrate 102 includes a semiconductor oxide such as, for example, silicon dioxide. In other embodiments of the present invention, the dielectric material that can provide substrate 102 includes a semiconductor nitride such as, for example, silicon nitride. Other dielectric materials such as, for example, dielectric oxides, including metal oxides such as aluminum oxide, can also be used in the substrate 102.

In some embodiments of the present invention, substrate 102 includes a combination of a semiconductor material and a dielectric material. For example, substrate 102 can include a material stack of, from bottom to top, a silicon dioxide layer and a silicon layer. An optional handle substrate can be located beneath the silicon dioxide layer. The optional handle substrate can include of a semiconductor material, insulator, or conductive material.

Substrate 102 can also include a ceramic material, an elemental metal, an alloy of an elemental material or any other material or combination of materials that can be readily patterned as described herein and thereafter readily removed from an electrode structure that is subsequently formed to provide substrate 102. According to one or more embodiments of the present invention, the substrate 102 includes one or more polymeric materials. The polymeric materials can be natural or synthetic polymers or copolymers, such as block copolymers.

The base layer 104 arranged on the substrate 102 can include one or more conductive materials. The base layer 104 can be any material. The material can be a conductive material, such as a metal, but does not need to be conductive material. According to some embodiments of the present invention, the material is a conductive electrode material such that the base layer 104 provides an electrode base. The material can include a metallic material, including an alloy of more than one metal. The conductive material can include an alloy of metallic components, or metallic and non-metallic components. The conductive material can include, but is not limited to, platinum, copper, silver, gold, tungsten, aluminum, iron, palladium, nickel, titanium, zirconium, phosphorus, carbon, or a combination thereof. In one or more embodiments of the present invention, the conductive material is in a crystalline state. In other embodiments of the present invention, the conductive material is in an amorphous state.

The base layer 104 includes one or more layers. According to one or more embodiments of the present invention, the base layer 104 includes more than one layer, such as one or more metallic seed layers. Non-limiting examples of metallic seed layers include Ti, Au, Cu, Pt, or a combination thereof. The thickness of the metallic seed layer, when included, may range from less than 10 nanometers to an excess of 10 microns, which is not limited within the scope of embodiments of the present invention. Electrical resistance of the metallic seed layer is less than or equal to 100 ohms according to one or more embodiments of the present invention, and less than 1 ohm according to other embodiments of the present invention.

Figure 1C:
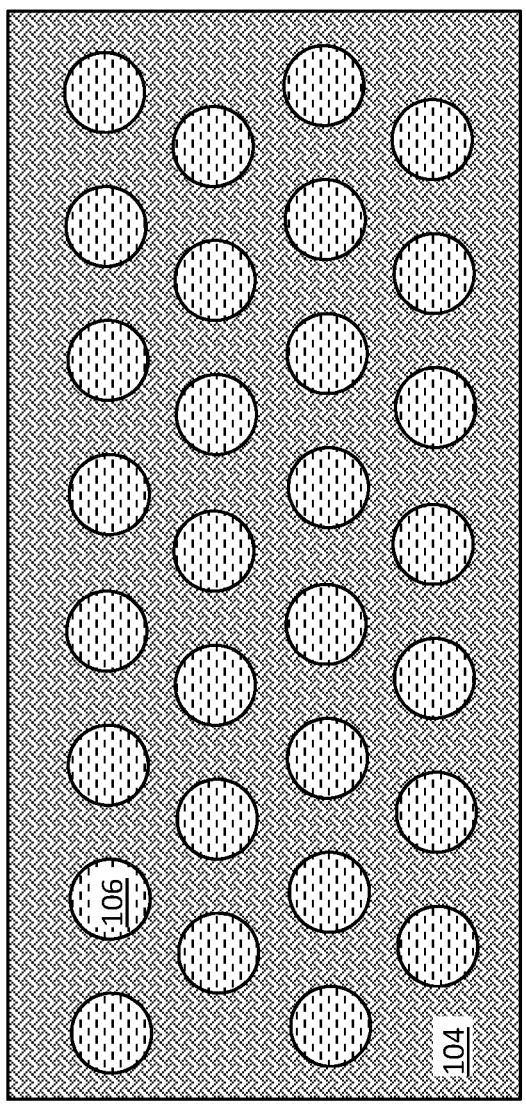

FIG. 1B depicts a cross-sectional side view after forming an array of nano-patterned features 106 having non-random topography on a surface of the base layer 104. FIG. 1C depicts a top view of FIG. 1B. The nano-patterned features 106 are an array of non-random repeating (i.e., regularly repeating) individually articulated features formed on the exposed surface of base layer 104. The repeating individually articulated features can include various form factors with various shapes and sizes. Non-limiting examples of shapes for each repeating individually articulated features include rods, cones, annular structures (e.g., hollow tubes), or any combination thereof.

In one or more embodiments of the present invention, the nano-patterned features 106 have a critical dimension 112, i.e., diameter or width, from about 5 nm to about 900 nm. In other embodiments of the present invention, the nano-patterned features 106 have a critical dimension from about 20 nm to about 300 nm. In some embodiments of the present invention, the nano-patterned features 106 have a height 113 ranging between 5 nm to 20 micrometers (µm). In one or more embodiments of the present invention, each of nano-patterned features 106 has an aspect ratio (i.e., ratio of width to height) of from about 0.5:1 to about 50:1. In other embodiments of the present invention, each of nano-patterned features 106 has a pitch 115, and a pitch ratio ranging from about 2:1 to 20:1. "Pitch ratio" (115:112) refers to the ratio of the minimum center-to-center distance of nearest-neighbor features 115 with respect to the critical diameter of the nano-topography elements 112).

The nano-patterned features 106 can include one or more conductive material(s). The conductive material forming the nano-patterned features 106 can be the same as the conductive material forming the base layer 104 according to some embodiments of the present invention. In other embodiments of the present invention, the conductive material forming the nano-patterned features 106 is different than the conductive material forming the base layer 104. The conductive material forming the nano-patterned features 106 can include a metallic material, including an alloy of more than one metal. The conductive material can include an alloy of metallic components, or an alloy of metallic and non-metallic components. The conductive material can include, but is not limited to, platinum, copper, silver, gold, tungsten, aluminum, iron, palladium, nickel, titanium, zirconium, phosphorus, carbon, or a combination thereof. In one or more embodiments of the present invention, the conductive material is in a crystalline state.

Depending on the materials used for the nano-patterned features 106, various methods can be used to form the nano-patterned features 106. Photolithography and etching and electrical plating are non-limiting examples of methods that can be used to form the nano-patterned features 106 on the surface of the base layer 104.

According to one or more embodiments of the present invention, the nano-patterned features 106 include gold. In an additional embodiments of the present invention, the nano-patterned features 106 can include platinum. In yet other embodiments of the present invention, a combination of gold and platinum can be utilized. Using gold and/or platinum for the nano-patterned feature material platform provides advantages of being both semiconductor compatible and biocompatible.

Figure 1D:
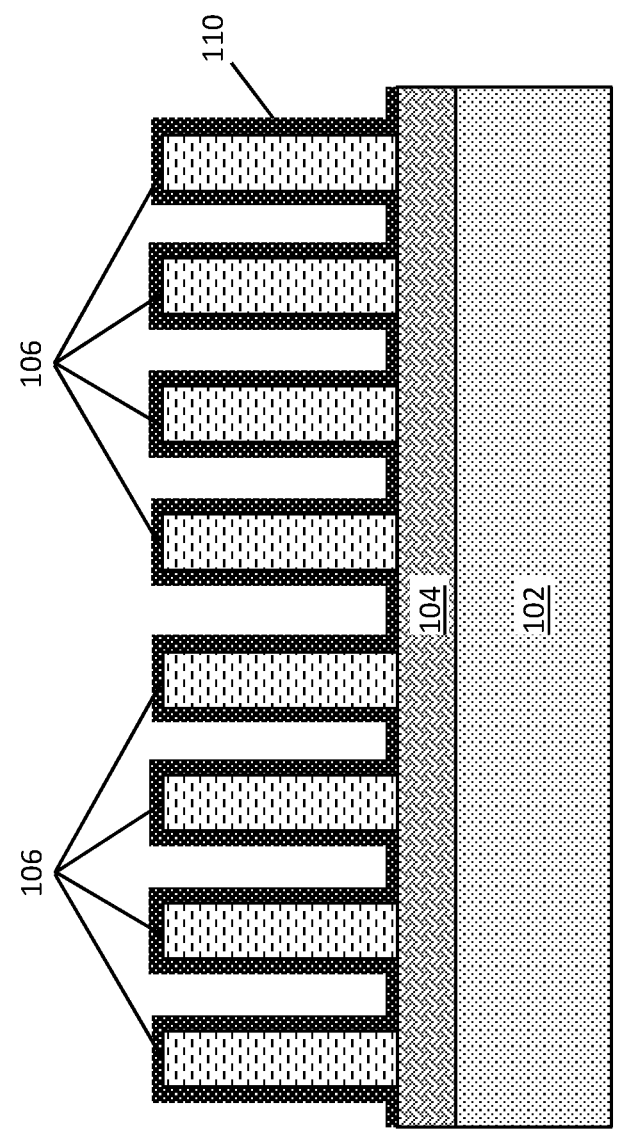

FIG. 1D depicts a cross-sectional side view after depositing an encapsulating metal layer 110 on the nano-patterned features 106. The encapsulating metal layer 110 is deposited as a thin layer that encapsulates exposed surfaces of the nano-patterned features 106 and base layer 104. The encapsulating metal layer 110 can also coat or partially coat the base layer 104. According to some embodiments of the present invention, the encapsulating metal layer 110 has a thickness of about 10 Å to about 500 Å.

Depending on the materials used for the encapsulating metal layer 110, various methods can be used to form the encapsulating metal layer 110. Electroplating, either by electrolytic (with a current source) or electroless (no electric current source), is a non-limiting examples of a method that can be used to form the encapsulating metal layer 110 on the nano-patterned features 106. Other methods include atomic layer deposition (ALD), chemical vapor deposition (CVD), physical vapor deposition (PVD), and other processes known to those skilled in the art.

The encapsulating metal layer 110 includes one or more conductive materials. The conductive material can include a metallic material, including an alloy of more than one metal. The conductive material can include an alloy of metallic components, or metallic and non-metallic components. According to some embodiments of the present invention, the encapsulating metal layer 110 includes platinum. The conductive material of the encapsulating metal layer 110 can include, but is not limited to, copper, silver, gold, tungsten, aluminum, iron, palladium, nickel, titanium, zirconium, phosphorus, carbon, or a combination thereof. In one or more embodiments of the present invention, the conductive material is in a crystalline state.

Figure 1E:
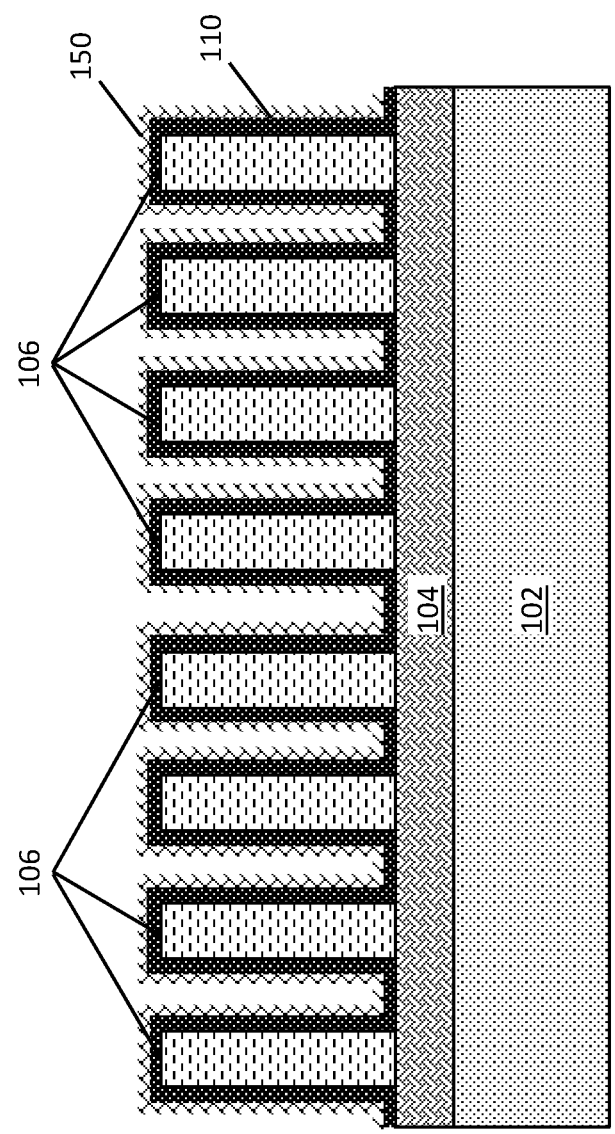

FIG. 1E depicts a cross-sectional side view after functionalizing the surface of the encapsulating metal layer 110. Functionalization refers to the process of applying a biological agent or other substance to enable a specific biological function for the sensor platform. After forming the base layer structure, in order to functionalize the structure to respond as a biosensor specifically to detect a desired biological agent, a biological functionalization material 150 can be applied to the surface of the base layer structure, including nano-patterned features 106. Any of the exposed areas of the base layer 104 or encapsulating metal layer 110 are also coated with the biological functionalization material 150. The nanostructure, with or without the biological functionalization material 150, can be used as a component such as a working electrode in various biosensors which include other well-known components, such as but not limited to, reference and counter electrode structures.

"Biological functionalization material" refers to any bioreceptor that binds with a complementary target biomolecule to create a binding event. In some embodiments of the present invention, biochemical reactions involving the biological functionalization material 150, which would produce a reaction product upon binding with the target biomolecule. Non-limiting examples of biological functionalization materials 150 that can be used include an oligonucleotide, a nucleic acid, a peptide, a ligand, a protein, an enzyme, or any other material apt to bind with a complementary target biomolecule. When the nanostructure is used for glucose sensing, the biological functionalization material 150 can include glucose oxidase or glucose dehydrogenase. The biological functionalization material 150 can be applied to the nanostructure utilizing established biological functionalization processes known to those skilled in the art. Such biological functionalization processes can include a series of chemical reactions that attach the biological functionalization material 150 on the surface of the nanostructure.

Figure 2B:
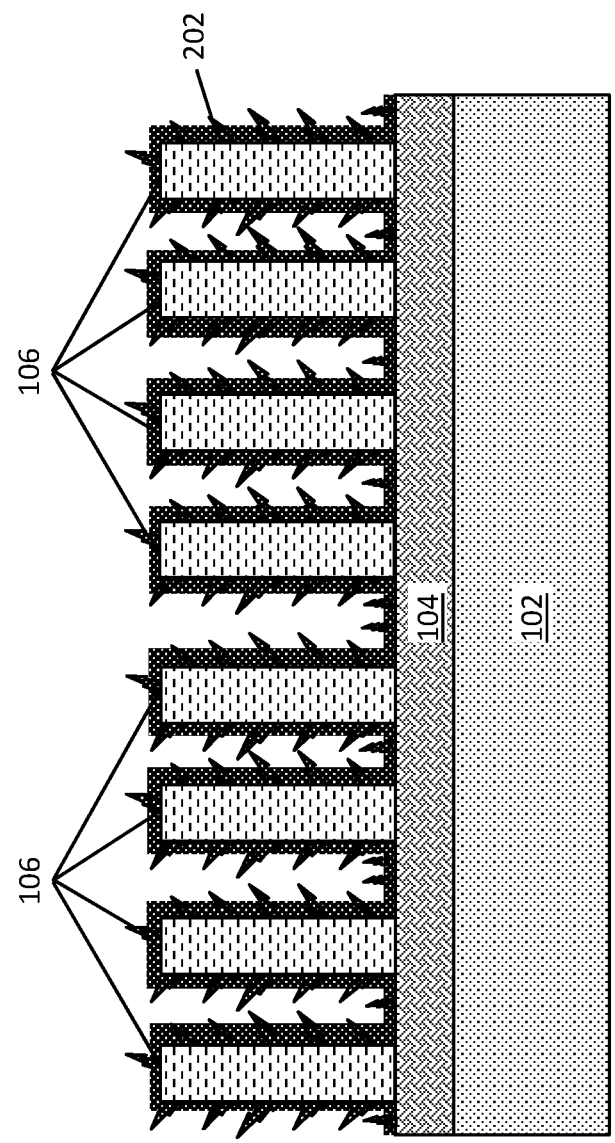

FIGS. 2A-2C depict a method of forming a nanostructure according to one or more embodiments of the present invention. FIG. 2A depicts a cross-sectional side view of an array of nano-patterned features 106 having non-random topography on the surface of the base layer 104. The array of nano-patterned features 106 includes one or more conductive materials, as described above. According to exemplary embodiments of the present invention, the nano-patterned features 106 include gold.

FIG. 2B depicts a cross-sectional side view after depositing a textured layer of metal 202 on the nano-patterned features 106. The textured layer of metal 202 is deposited as a coating on the exposed top and sidewall surfaces of the nano-patterned features 106. The textured layer of metal 202 may or may not cover exposed surfaces of the base layer 104. The textured layer of metal 202 includes a textured surface that appears "dendritic" (with branches or as tree-like) according to some embodiments of the present invention. The textured layer of metal 202 provides a high surface area to the nanostructure.

The textured layer of metal 202 includes one or more conductive materials. The conductive material can include a metallic material, including an alloy of more than one metal. The conductive material can include an alloy of metallic components, or metallic and non-metallic components. According to some embodiments of the present invention, the textured layer of metal 202 includes platinum. The conductive material of the textured layer of metal 202 can include, but is not limited to, copper, silver, gold, tungsten, aluminum, iron, palladium, nickel, titanium, zirconium, phosphorus, carbon, or a combination thereof. In one or more embodiments of the present invention, the conductive material is in a crystalline state. In other embodiments of the present invention, the conductive material is in an amorphous state.

FIG. 2C depicts a cross-sectional side view after functionalizing the surface of the textured layer of metal 202. After forming the electrode structure, in order to functionalize the structure to respond as a biosensor sensitive to a specific agent, a biological functionalization material 150 can be applied to the surface of the nanostructure (nano-patterned features 106 with the textured layer of metal 202). The exposed surface areas of the base layer 104 can also be coated with the biological functionalization material 150. The nanostructure, with or without the biological functionalization material 150, can be used as a component such as a working electrode structure in various biosensor structures which include other well-known components, such as but not limited to, reference and counter electrode structures.

Figure 3B:
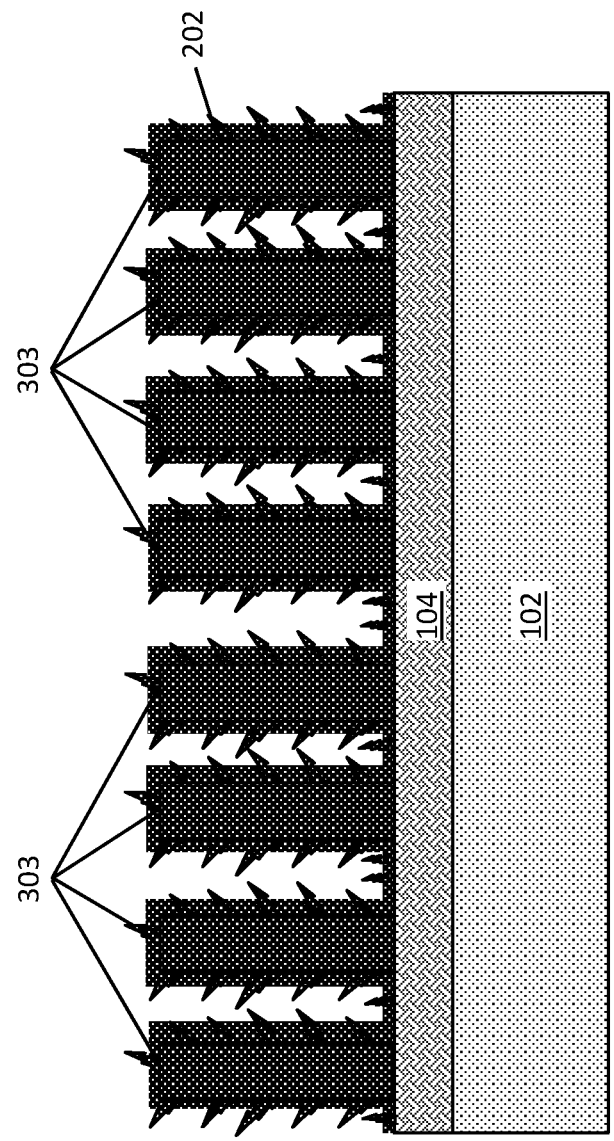
Figure 3C:
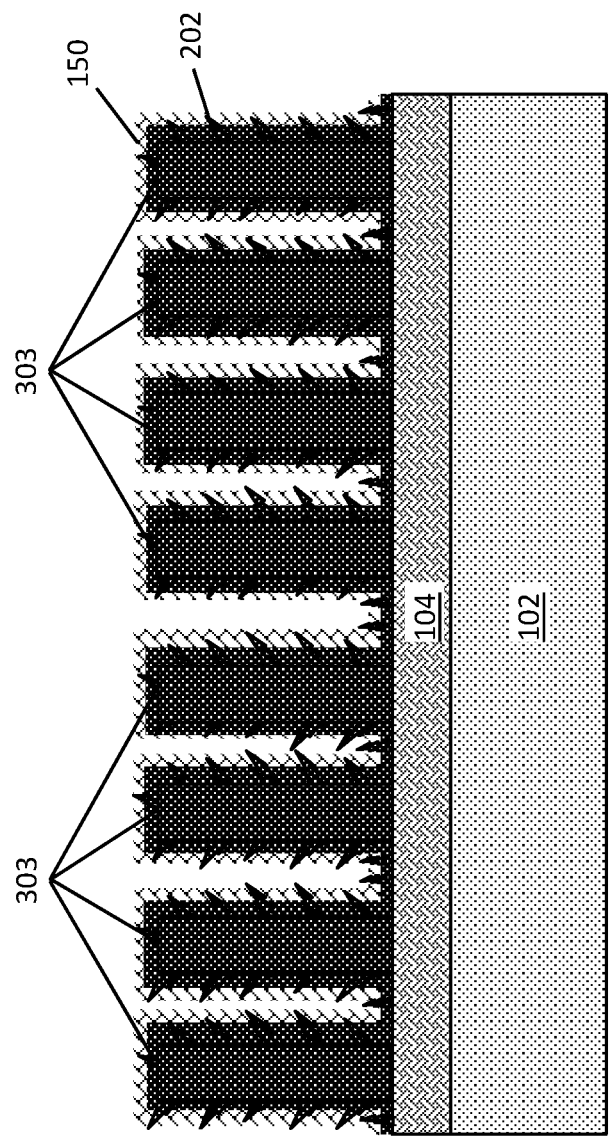

FIGS. 3A-3C depict a method of forming a nanostructure according to one or more embodiments of the present invention. FIG. 3A depicts a cross-sectional side view of an array of nano-patterned features 303 having non-random topography on the surface of the substrate 104. The array of nano-patterned features 303 includes one or more conductive materials, as described above. According to exemplary embodiments of the present invention, the nano-patterned features 303 include platinum.

FIG. 3B depicts a cross-sectional side view after depositing a textured layer of metal 202 on the nano-patterned features 303. The textured layer of metal 202 is deposited as a coating that includes one or more conductive materials. The textured layer of metal 202 may or may not cover exposed surfaces of the base layer 104. The textured layer of metal 202 includes a textured surface that appears "dendritic" (with branches or as tree-like) according to some embodiments of the present invention. The textured layer of metal 202 provides an increase in the exposed surface area.

According to some embodiments of the present invention, both the textured layer of metal 202 and the nano-patterned features 303 include the same conductive material, e.g., platinum.

FIG. 3C depicts a cross-sectional side view after functionalizing the surface of the textured layer of metal 202. After forming the nanostructure, in order to functionalize the structure to respond as a biosensor sensitive to specific biological agents, a biological functionalization material 150 can be applied to the surface of the nanostructure (nano-patterned features 303 and the textured layer of metal 202). Any of the exposed areas of the base layer 104 are also coated with the biological functionalization material 150. The nanostructure, with or without the biological functionalization material 150, can be used as a component, such as a working electrode structure in various biosensor structures in various biosensors which include other well-known components, such as but not limited to, reference and counter electrode structures. As shown in FIG. 3C, the biological functionalization material 150 can be arranged directly on the textured metal layer of metal 202 such that portions of the dendritic structures extend through portions of the biological functionalization material 150.

Figure 4A:
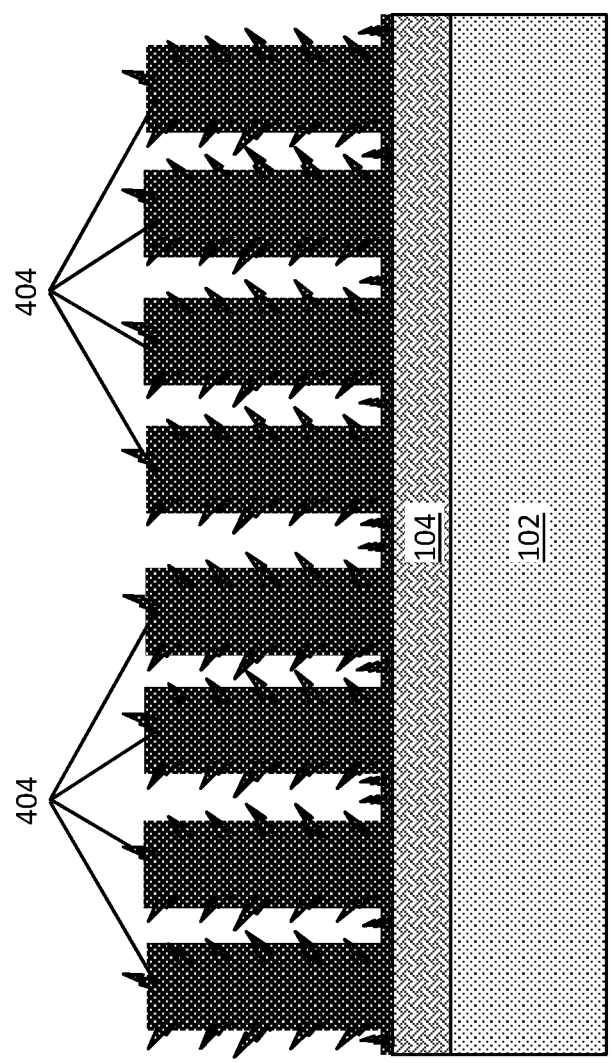
Figure 4B:
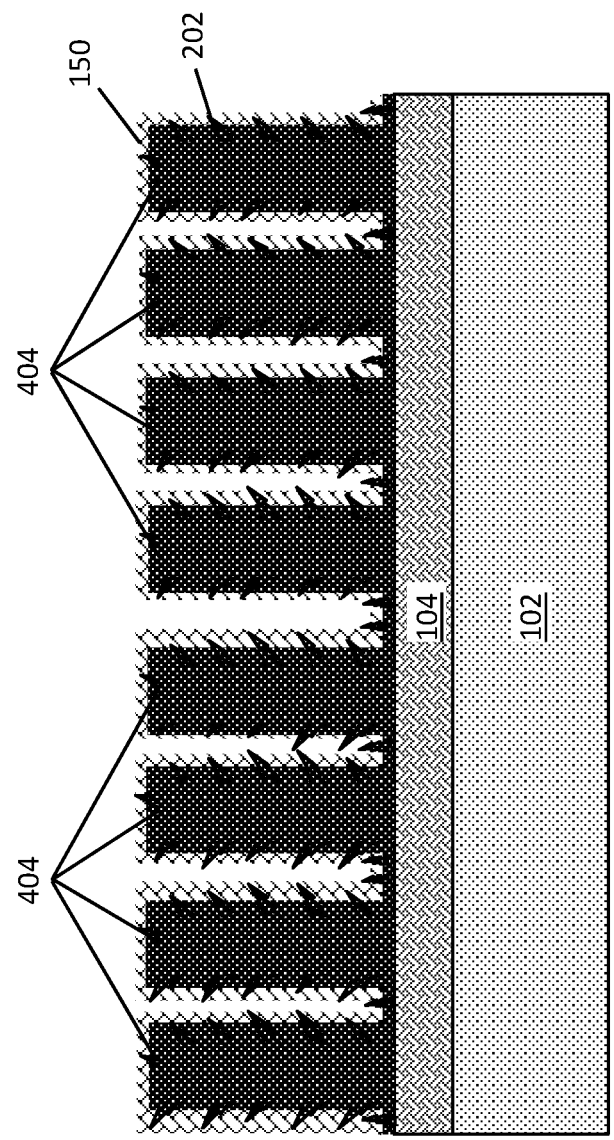

FIGS. 4A-4B depict a method of forming a nanostructure according to one or more embodiments of the present invention. FIG. 4A depicts a cross-sectional side view of an array of nano-patterned features 404 having non-random topography and a textured surface. There is no interface formed between the base nano-patterned features 404 and textured surface finish. "No interface" is defined as the nano-patterned features 404 and the textured surface are of unitary construction (i.e., one piece) and unitary composition (i.e., a same material).

The nano-patterned features 404 with the textured surface can be formed by any methods suitable for the materials used to form the nano-patterned features 404. A non-limiting example of a method that can be used to form the nano-patterned features 404 with the textured surface includes electroplating.

The textured surface appears "dendritic" (with branches or as tree-like) according to some embodiments of the present invention. The textured surface enhances the exposed surface area of the nanofeatures. According to one or more embodiments of the present invention, the nano-patterned features 404 having the textured surface include platinum.

FIG. 4B depicts a cross-sectional side view after functionalizing the surface of the nano-patterned features 404. After forming the nanostructure, in order to functionalize the structure to respond as a biosensor sensitive to specific biological agents, a biological functionalized material 150 can be applied to the surface of the nanostructure (nano-patterned features 404 with the textured surface). Any of the exposed areas of the base layer 104 are also coated with the biological functionalization material 150. The nanostructure, with or without the biological functionalization material 150, can be used as a component, such as a working electrode structure in various biosensor structures which include other well-known components, such as but not limited to, reference and counter electrode structures.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8 percent or 5 percent, or 2 percent of a given value.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A nanostructure comprising:
   a base layer comprising a surface;
   nano-patterned features comprising non-random topography located on the surface of the base layer;
   a textured metal layer comprising a conductive material arranged directly on the nano-patterned features, the textured metal layer being a coating that covers all exposed sidewall surfaces of the nano-patterned features, the textured metal layer comprising dendritic structures; and
   a biological functionalization material arranged directly on the textured metal layer such that portions of the dendritic structures extend through portions of the biological functionalization material.

2. The nanostructure of claim 1, wherein the nano-patterned features comprise gold, platinum, copper, silver, tungsten, aluminum, iron, palladium, nickel, titanium, zirconium, phosphorus, carbon, or a combination thereof.

3. The nanostructure of claim 1, wherein the textured metal layer comprises platinum, copper, silver, gold, tungsten, aluminum, iron, palladium, nickel, titanium, zirconium, phosphorus, carbon, or a combination thereof.

4. The nanostructure of claim 1, wherein the non-random topography comprises repeating individually articulated features, and each repeating individually articulated feature has a width from 5 to 900 nm, and a height from 5 nm to 20 μm.

5. The nanostructure of claim 3, wherein the textured metal layer is platinum.

6. The nanostructure of claim 1, wherein the conductive material of the textured metal layer is in a crystalline state.

7. The nanostructure of claim 1, wherein the conductive material of the textured metal layer is in an amorphous state.

8. The nanostructure of claim 1, wherein the conductive material includes a metallic material.

9. The nanostructure of claim 1, wherein the conductive material includes a metallic alloy.

10. The nanostructure of claim 1, wherein the conductive material includes a non-metallic component.

* * * * *